United States Patent [19]
Jones et al.

[11] Patent Number: 5,737,583
[45] Date of Patent: Apr. 7, 1998

[54] DIGITAL CIRCUIT SIMULATION

[75] Inventors: Clive Richard Jones, Cambridge; Richard William Earnshaw, Teversham, both of United Kingdom

[73] Assignee: Advanced Risc Machines Limited, Cambridge, United Kingdom

[21] Appl. No.: 527,156

[22] Filed: Sep. 12, 1995

[30] Foreign Application Priority Data

Jul. 13, 1995 [GB] United Kingdom ............... 9514304

[51] Int. Cl.$^6$ ............................................. G06F 15/16
[52] U.S. Cl. ................................. 395/500; 364/578
[58] Field of Search ........................... 395/500; 364/578, 364/488–491

[56] References Cited

U.S. PATENT DOCUMENTS

| | | | |
|---|---|---|---|
| 4,342,093 | 7/1982 | Miyoshi | 364/578 |
| 5,081,601 | 1/1992 | Eirikasson | 364/578 |
| 5,193,068 | 3/1993 | Britman | 364/578 |
| 5,410,673 | 4/1995 | Oguri | 395/500 |
| 5,426,768 | 6/1995 | Kanazawa | 395/500 |
| 5,475,832 | 12/1995 | Shoji et al. | 395/500 |
| 5,493,672 | 2/1996 | Lau et al. | 395/500 |
| 5,546,562 | 8/1996 | Patel | 395/500 |
| 5,603,015 | 2/1997 | Kurosawa | 395/500 |
| 5,613,062 | 3/1997 | Hasede et al. | 395/183.13 |

FOREIGN PATENT DOCUMENTS

| | | | |
|---|---|---|---|
| 2 229 300 | 9/1990 | United Kingdom | G06F 15/60 |
| 2 248 321 | 4/1992 | United Kingdom | G06F 15/60 |

Primary Examiner—Kevin J. Teska
Assistant Examiner—A. S. Roberts
Attorney, Agent, or Firm—Albert C. Smith; Fenwick & West LLP

[57] ABSTRACT

A primary circuit model using a primary simulator 40' operates in conjunction with a plurality of secondary circuit models 10, 20, 30 using a secondary simulator 100. Only signals external to the secondary circuit models are passed between the primary simulator and the secondary simulator. The primary simulator and the secondary simulator independently increment their simulated time when they are active. The secondary simulator is invoked when a signal to which one of the secondary circuit models is responsive is changed by the primary simulator. The secondary simulator is not exited until no further signal changes are being driven by the secondary circuit models at which stage the last asserted values of signals changed by the secondary circuit models are returned to the primary model. If there are pending signal changes within the secondary simulation when it is entered in response to a signal from the primary simulator, then that primary simulator signal is buffered until those pending signal changes have taken place.

13 Claims, 7 Drawing Sheets

DIGITAL CIRCUIT SIMULATION

BACKGROUND OF THE INVENTION

1. Field of the Invention

This invention relates to the field of digital circuit simulation.

2. Description of the Prior Art

It is known to provide digital circuit simulation systems in which the functions of a digital circuit are simulated by a general purpose computer operating under software control with a model defining the digital circuit to be simulated. Such digital circuit simulation has many advantages. For example, a design may be simulated and tested to remove faults in the design before it is submitted for fabrication. Where a digital circuit is intended to be used with other circuits, then a simulation of the circuit can be utilised to enable the development of such other circuits to proceed in parallel with the simulated digital circuit which has not yet been reduced to a fabricated form.

Several digital circuit simulation computer programs are commercially available. Four examples are "Vantage Spreadsheet", "Synopsis Vss", "Cadence Verilog" and "Modeltech V System".

A common approach when using such simulation software is that the producer of a digital circuit, such as a new microprocessor, will supply a model of that microprocessor that may be used with such simulation software to enable third parties to develop circuits to operate with that new microprocessor. This approach has the significant disadvantage that far more detailed information concerning the internal design of the new microprocessor is released than would otherwise be necessary. The models of the new microprocessor that are supplied may be relatively easily analyzed to determine the internal operation of the new microprocessor, whereas all that in reality is required by the third party is that the model they work with should simulate the external inputs and outputs of the microprocessor.

In order to address this problem, a technique has been proposed in our co-pending British Patent Application No. 9511617.4 in which the new microprocessor is simulated with its own separate simulation software and microprocessor model with that separate simulation software interfacing with general purpose simulation software fop which the third parties may write their models. In this way, the internal operation and detailed structure of the new microprocessor is hidden within its own simulation system with that simulation system expressing only the external inputs and outputs that would be provided by a physical version of the microprocessor.

In the known approach a single simulation system controls both the proprietary microprocessor model and the third party circuits interacting with that microprocessor model. The single simulation system is thus able to control the sequencing of events and propagation of signals through the entire model. A problem arises in coordinating the control, sequencing and propagation of signals in the system in which the external inputs and outputs of circuit, such as a microprocessor, are simulated by a separate simulation system and model that as a whole acts as a component within an overlying simulation system to which third parties attach their device models. It is an object of the present invention to address these problems.

SUMMARY OF THE INVENTION

Viewed from one aspect the present invention provides a method of simulating a digital circuit comprising a primary circuit coupled to a plurality of secondary circuits using a primary circuit model and a plurality of secondary circuit models, said method comprising the steps of:

(i) simulating with said primary circuit model signals exchanged within said primary circuit, said primary circuit model operating through a sequence of primary simulated times separated by primary time increments;

(ii) when said primary circuit model advances at a primary simulated time at which said primary circuit model changes a signal value to which at least one of said secondary circuit models is responsive, stopping simulating signals exchanged within said primary circuit, stopping incrementing said primary simulated time and passing said signal to said at least one of said secondary circuit models;

(iii) simulating with said plurality of secondary circuit models signals exchanged between said plurality of secondary circuits, said plurality of secondary circuit models operating through a sequence of secondary simulated times separated by secondary time increments;

(iv) when no further signal exchanges are driven by said plurality of secondary circuit models, stopping incrementing said secondary simulated time and passing to said primary circuit model the last asserted value of any signals changed by said plurality of secondary circuit models during incrementing of said secondary simulated time and to which said primary circuit model is responsive; and (v) restarting simulation with said primary circuit model of signals exchanged within said primary circuit and incrementing of said primary simulated time.

The present invention both recognises and solves a problem that arises when operating with different simulators each having control over its own sequencing of events and propagation of signals. The problem that arises is that when the primary circuit model issues a signal to the secondary circuit models, it hands over control to the secondary circuit models which then independently simulate what their response is to the signal (of signals) that has been passed to them. Determining what this response of the secondary circuit models will be will typically take many increments of the secondary simulated time as the signals propagate through the secondary circuit models. During this period, the signal values of many of the signals to which the primary circuit model will be responsive may change several times until finally settling to their eventual output signal value. Such changes before settling may correspond in a physical circuit to a signal that takes an indeterminate value for a short period of time before reaching a defined state, e.g. a circuit comprising combinatorial logic in which several inputs change more or less at the same time each having potential consequences to the output value.

In order to deal with this problem that is recognised by the invention, the simulation of the secondary circuits is such that the system waits until the secondary circuit models have finished exchanging signals (i.e. the model has settled into its state representing its response to the input signal supplied to it) and then returns to the primary circuit model the last asserted values of the signals to which the primary circuit model is responsive. In this way, spurious signal values that may arise as a result of the operation of the secondary circuit models are not passed to the primary circuit model in which they could produce incorrect operation.

The above technique for improving the manner in which two simulation systems work together may be applied in many different circumstances. However, as previously mentioned, there is a particular motivation for operating two simulation systems together in circumstances in which said plurality of secondary circuit models exchange only external signals with said primary circuit models.

In such circumstances where the internal signals of the plurality of secondary circuit models are not passed to the primary circuit model, it is not possible to use the simulation software controlling the primary circuit model to also control the plurality of secondary circuit models and accordingly the problem of coordinating the operation of two separate simulation systems arises.

A further problem of coordinating the two simulation systems can result when one of the secondary circuit models issues a signal with a zero delay (a priority signal) that must be immediately dispatched to the primary circuit model. The possibility then arises that the primary circuit model's response to this priority signal will change signal values to which the plurality of secondary circuit models are responsive and so cause a re-entry into the secondary circuit simulation. Such a re-entry must be controlled since the plurality of secondary circuit models have not yet dealt with the full consequences of the signals from the primary circuit model that were previously applied to them.

Accordingly, in embodiments of the invention in which any of said plurality of secondary circuit models may issue a priority signal to said primary circuit model that is passed to said primary circuit model whilst signal exchanges are still being driven by said plurality of secondary circuit models, if said priority signal triggers passing of one or more further signals from said primary circuit model to said plurality of secondary circuit models, then said one or more further signals are buffered and not applied to said plurality of secondary circuit models until no further signal exchanges are driven by said plurality of secondary circuit models resulting from the state of said plurality of secondary circuit models preceding issue of said priority signal.

In this way, priority signals that are immediately dispatched to the primary circuit model are allowed and yet the problems of uncontrolled re-entry into the secondary simulation are avoided.

It will be appreciated that the primary simulated time increments and the secondary simulated time increments may have any duration. More particularly, there are circumstances in which signal transfers take place in a definite order but with substantially no time difference between them. In order to model this, said primary simulated time increments and said secondary simulated time increments may be delta time increments of substantially zero length. Such delta time increments may be considered analogous to a mathematical delta function that has a finite integrated area but an infinitely small width. In this context, the order of delta time increments may be controlled but the elapsed simulated time will be effectively zero.

It will be appreciated that the secondary simulation system can take a number of forms providing that it effectively yields the plurality of second circuit models. However, a preferred implementation is one in which said primary circuit model passes a signal to an interface controller that buffers and redirects said signal to those of said plurality of secondary circuit models that are responsive to said signal.

In order that the last asserted signal values produced by the secondary circuit models can be determined, it is preferred that said interface controller stores data indicative of the asserted value of signals changed by said plurality of secondary circuit models and the secondary simulated time at which those changes occurred.

It will be appreciated that it is theoretically possible that the primary circuit model and the secondary circuit models could be provided in some form of special purpose modelling hardware, e.g. PLAs. However, it is preferred that the circuit models are provided by a general purpose data processing apparatus operating under control of program instructions.

It will be appreciated that the plurality of secondary circuit models could together represent any form of digital circuit, and particularly one which it was desired to keep confidential. However, the invention is particularly useful in embodiments in which said plurality of secondary circuit models represent a microprocessor circuit and said primary circuit model represents one or more devices to be connected to said microprocessor circuit.

Viewed from another aspect the present invention provides an apparatus for simulating a digital circuit comprising a primary circuit coupled to a plurality of secondary circuits, said apparatus comprising:

(i) a primary circuit model for simulating signals exchanged within said primary circuit, said primary circuit model operating through a sequence of primary simulated times separated by primary time increments;

(ii) a plurality of secondary circuit models for simulating signals exchanged between said plurality of secondary circuits, said plurality of secondary circuit models operating through a sequence of secondary simulated times separated by secondary time increments; and (iii) an interface controller for controlling the passing of signals between said primary circuit model and said plurality of secondary circuit models; wherein, (iv) when said primary circuit model advances to a primary simulated time at which said primary circuit model changes a signal value to which at least one of said secondary circuit models is responsive, said primary circuit model stops simulating signals exchanged within said primary circuit, stops incrementing said primary simulated time and passes said signal via said interface controller to said at least one of said secondary circuit models; and (v) when no further signal exchanges are driven by said plurality of secondary circuit models, said interface controller stops incrementing said secondary simulated time and passes to said primary circuit model the last asserted value of any signals changed by said plurality of secondary circuit models during incrementing of said secondary simulated time and to which said primary circuit model is responsive, whereupon said primary circuit model restarts simulation of signals exchanged within said primary circuit and incrementing of said primary simulated time.

The above, and other objects, features and advantages of this invention will be apparent from the following detailed description of illustrative embodiments which is to be read in connection with the accompanying drawings.

With each of the commercially available simulation packages mentioned in the introduction, blocks of C code can be written to simulate relatively small blocks of a microprocessor, such as a pipeline unit, a program counter, or even an arithmetic logic unit. Each block is then interfaced directly to the simulation package to provide a simulation of the entire microprocessor.

Figure 1:
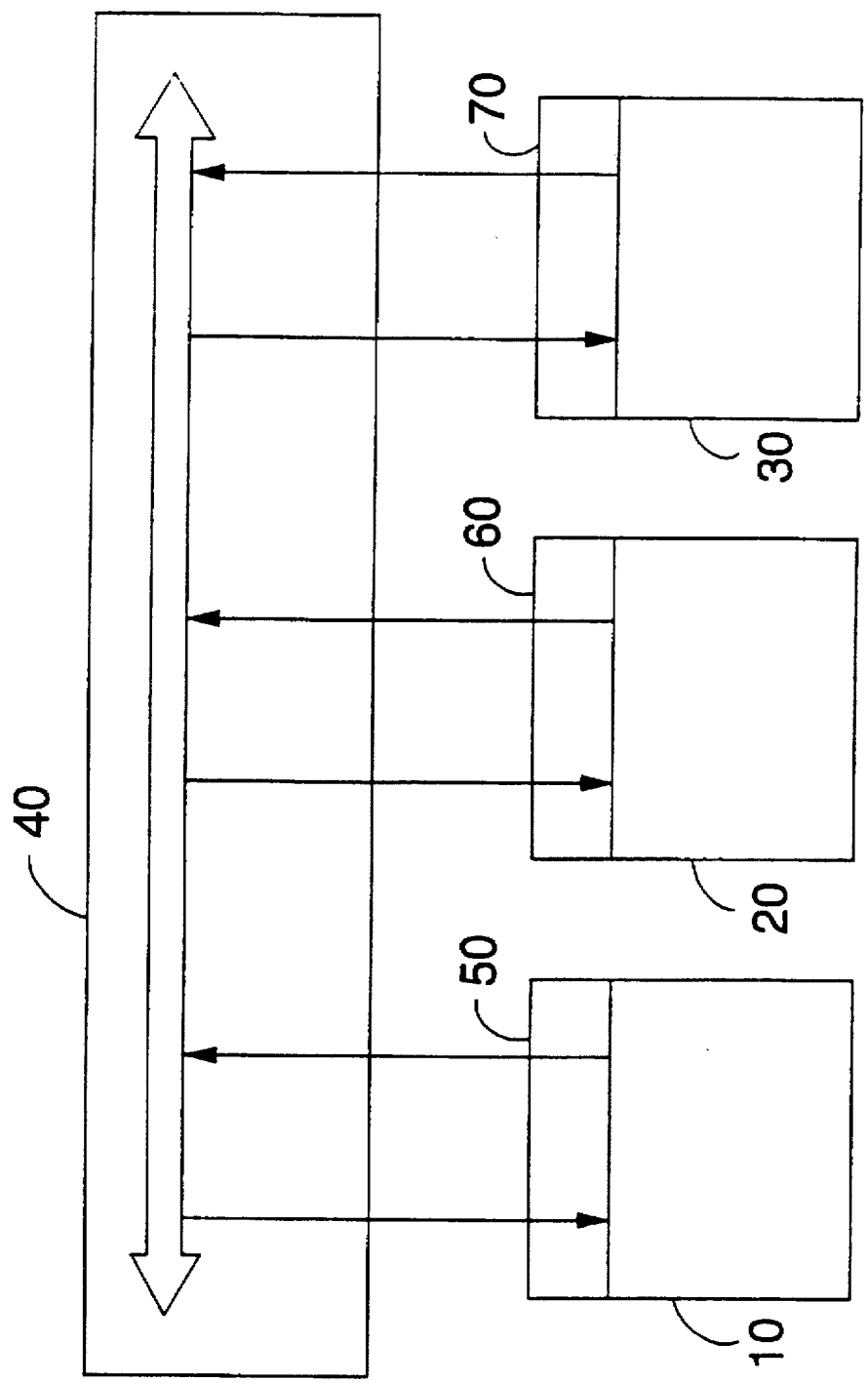
FIG. 1 is a schematic diagram showing the interaction of simulation blocks in a previously proposed digital circuit simulator.

An example of this arrangement is shown in FIG. 1 of the accompanying drawings, which is a schematic diagram showing the interaction of several of such simulation blocks 10, 20, 30 with a primary simulator 40 in a previously-proposed digital circuit simulator. The primary simulator 40 could be, for example, one of the four commercially available simulators mentioned above.

Each of the simulation blocks (secondary circuit models) 10, 20, 30 is written in the C programming language and simulates the operation of a respective part of a microprocessor. For example, a simulation block could simulate a multiplier unit, a status register, an instruction pipeline and so on.

In general, each simulation block will require and will generate two classes of input and output data. One of these classes, which will be referred to as "internal" data, is data representing internal signals passed between different component parts of the digital circuit. In the case of the simulation of a microprocessor, examples of such signals are internal register values or zero flags. In this case, when the integrated circuit is fabricated as a semiconductor product, internal signals such as these would not be routed to input/output pins or connections of the integrated circuit; they would simply be passed between internal components.

The other class of data is referred to as "external" data, and this represents electrical signals which are normally passed to and from the outside world when the circuit is fabricated as a semiconductor product. Examples of external signals are a clock signal and external address bus signals.

However, because in FIG. 1 the simulation blocks are connected to one another only via the primary simulator 40, both internal and external signals must be passed to and from the primary simulator 40. As described above, this means that details of the internal operation of the integrated circuit, in particular details of the internal signal traffic and the identity and function of the simulation blocks, which would otherwise be kept confidential, have to be disclosed to users of the simulator.

DESCRIPTION OF THE PREFERRED EMBODIMENTS

FIG. 1 illustrates a further feature of previously proposed simulators, which is the use of "veneers" to tailor the interface between the simulation blocks 10, 20, 30 and the particular primary simulator 40 in use. The veneers 50, 60, 70 allow the simulation blocks 10, 20, 30 and so on to be prepared in a genetic way, so that only a relatively small amount of work is required to add the veneers for communication with a particular primary simulator 40.

Figure 2:
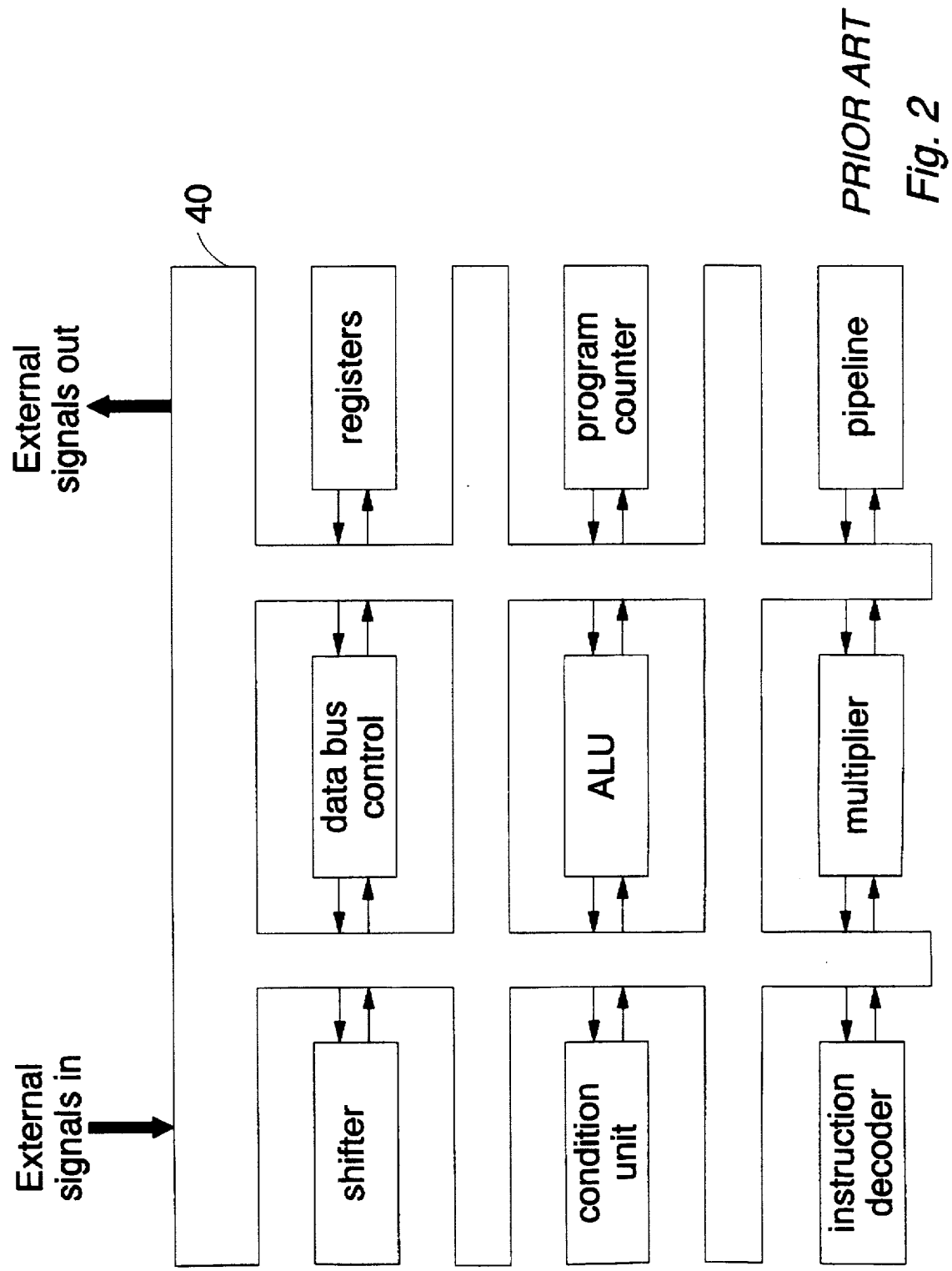
FIG. 2 is a schematic circuit diagram corresponding to the arrangement of FIG. 1.

FIG. 2 of the accompanying drawings is a schematic circuit diagram corresponding to the arrangement of FIG. 1. FIG. 2 illustrates a number of examples of simulation blocks (e.g. condition unit, multiplier, arithmetic logic unit (ALU), pipeline), interconnected via the primary simulator 40. Accordingly, although these blocks would communicate directly in a fabricated integrated circuit, in the simulator arrangement the blocks have to communicate via the primary simulator 40.

Figure 3:
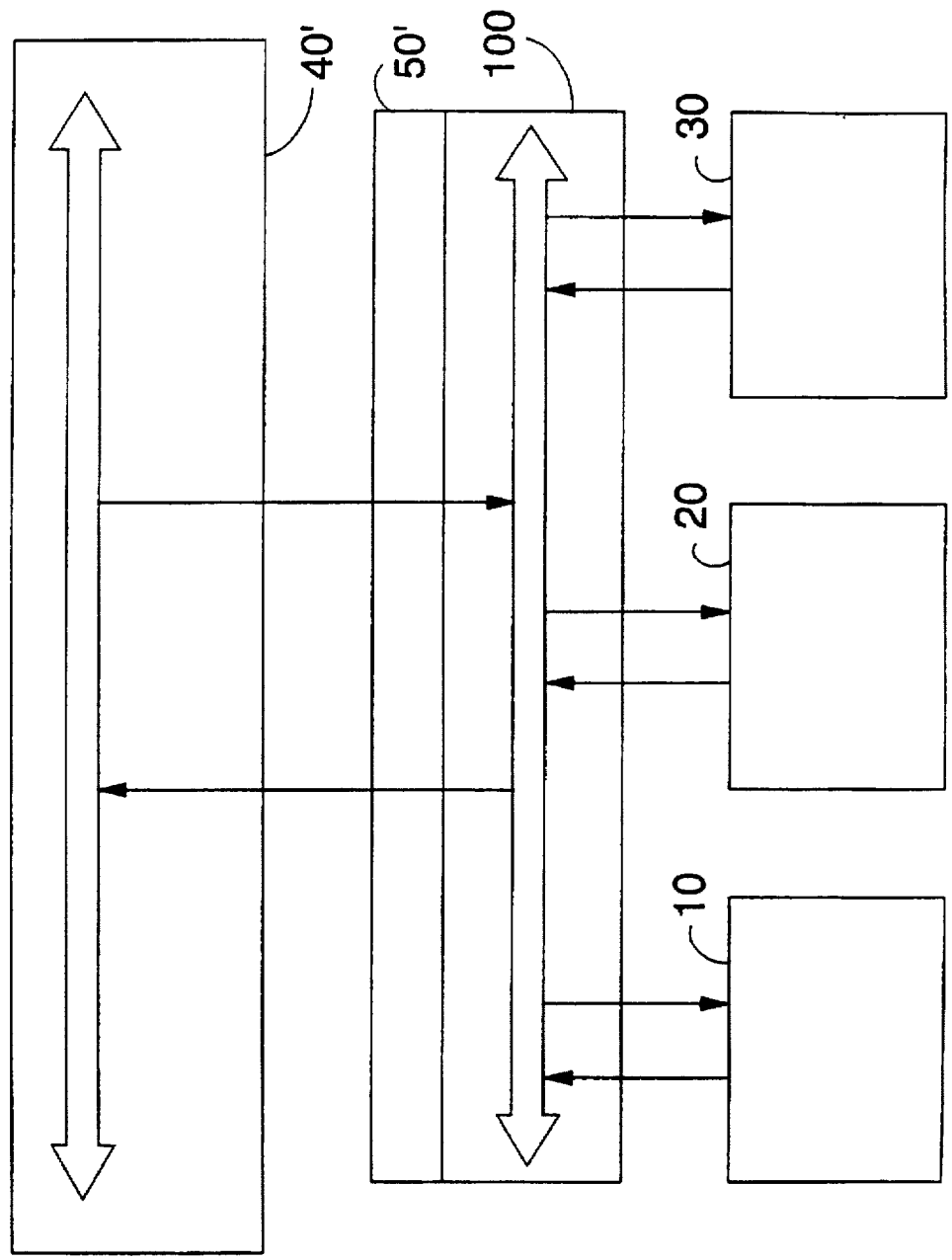
FIG. 3 is a schematic diagram showing the interaction of simulation blocks in an integrated circuit simulator according to an embodiment of the present invention.

FIG. 3 is a schematic diagram showing the interaction of simulation blocks in an integrated circuit simulator according to an embodiment of the present invention.

The simulation blocks 10, 20, 30 are similar to those described above. However, they communicate with a data interface block 100 rather than with the primary simulator (in this case, 40').

The data interface block 100 stores a list (not shown) of the data signals to be routed to and from the simulation blocks and the primary simulator. The list indicates the required destination of a received signal and also whether the signal is an internal or an external data signal (this information may in fact be implied in the destination information).

The operation of the data interface block 100 is straightforward, in that when it receives a data signal from a simulation block or the primary simulator 40', it routes that data signal according to the routing information in the stored list. (In a second embodiment this routing may involve the use of timing information; however, for ease of description, the use of such timing information will be described separately below).

In more detail, the following is a list of examples of simulation blocks, giving the data inputs and data outputs used by each block. In the table, external data signals are underlined; non-underlined signals are internal signals.

| Block | Inputs | Outputs |
|---|---|---|
| Shifter | clock, shift control, current instruction, B bus | shifted operand, shift carry |
| Data in bus | clock, data bus, data in control | B bus |
| Data out bus | clock, B bus, data out control | data bus |
| Address register | clock, ALU result, PC, address register control | address bus |
| Multiplier | clock, multiply control, A bus, B bus | A bus, B bus, multiplier zero flag |
| Arithmetic logic unit (ALU) | clock, A bus, shifted operand, carry in, current instruction, ALU control | ALU result, ALU status flags |
| Condition unit | clock, status flags, current instruction | not-execute flag |
| Instruction decoder | clock, current instruction | miscellaneous controls to other blocks |
| Register bank | clock, ALU result, register bank controls | A bus, B bus, PC |
| Program counter (PC) | clock, ALU result, PC controls | A bus, B bus, PC |
| Status register | clock, status register controls, shift carry, ALU status flags, multiplier zero flag | status flags |
| Pipeline | clock, data bus, pipeline controls | current instruction |

For example, a clock signal received as an external input signal from the primary simulator 40' is routed to all of the simulation blocks in accordance with the above table. In contrast, a program counter value is generated as an internal output signal by a program counter simulation block and is routed via the data interface block 100 directly to an address register interface block, i.e. not to the primary simulator 40'.

The result is that only external signals, which would normally be supplied as inputs or outputs of a fabricated semiconductor integrated circuit are exchanged with the primary simulator 40'.

A further feature is that only one veneer 50' is required, to control the interface between the data interface block 100 and the primary simulator 40'. It is no longer necessary to apply a veneer to each of the simulator blocks 10, 20, 30.

Figure 4:
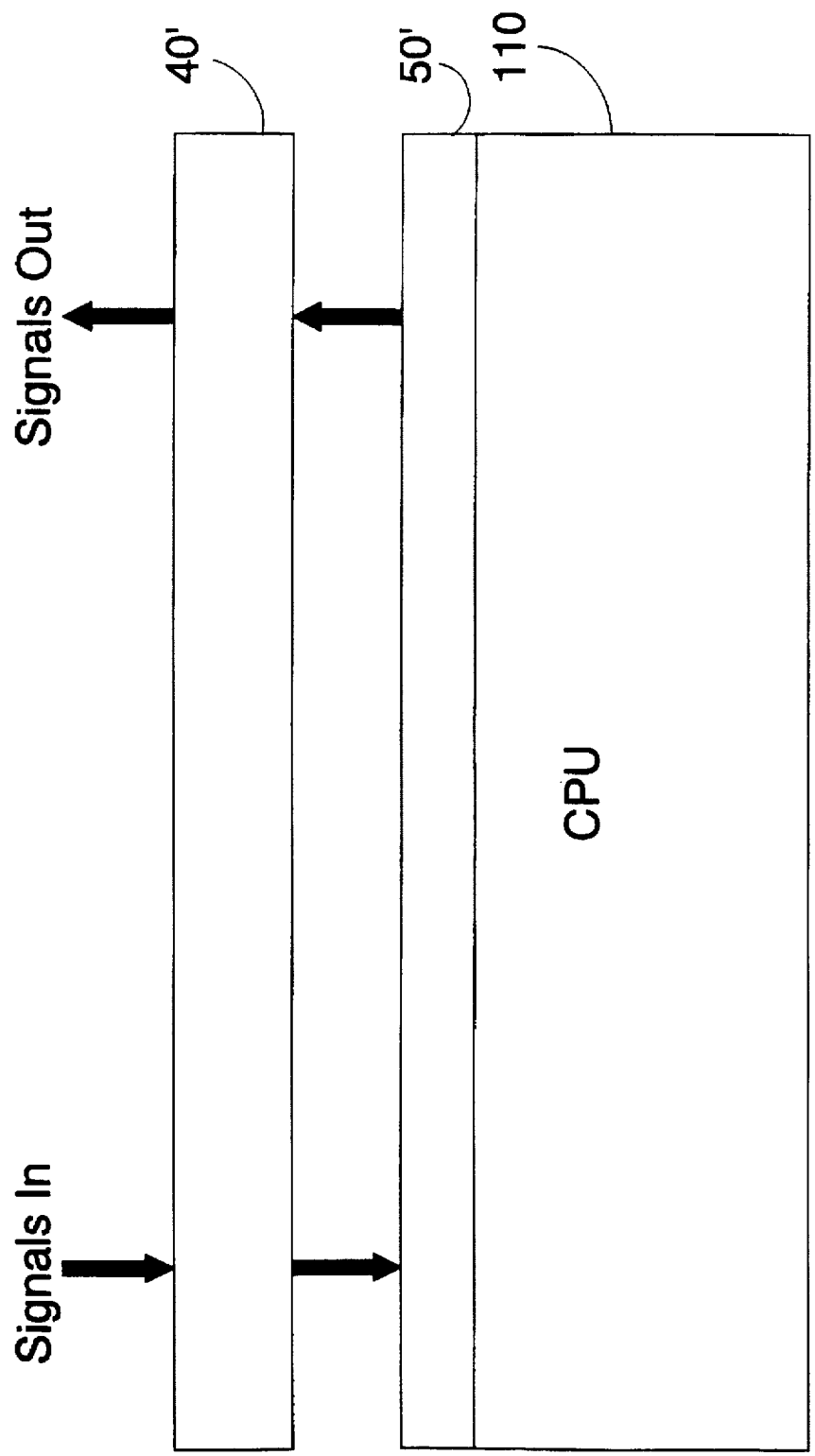
FIG. 4 is a schematic circuit diagram corresponding to the arrangement of FIG. 3.

The arrangement is illustrated schematically in FIG. 4, where in contrast to FIG. 2, the primary simulator 40' communicates with the simulated microprocessor 110 as a whole via the veneer 50'. Internal signals associated with internal operation of the microprocessor 110 do not need to be supplied to or from the primary simulator 40'.

In a second embodiment, timing information is included in the simulation to simulate events which take a finite time to complete. For example, a simulation block for simulating, say, a register block may be capable of providing an output value instantaneously with respect to simulation time, whereas the value would take a finite (real) time to compute in a real fabricated circuit. Accordingly, in order to simulate the operation of such a block, the simulation could receive a request for the contents of one of the registers at a certain time and instruct the block to generate the output data, but then not read the output data until an appropriate delay period (with respect to simulation time) after the request.

Previously, such events were scheduled for future execution by passing details to a scheduler forming part of the primary simulator. However, this would force details of the actions to be provided to the user of the primary simulator.

To avoid this problem, in a second embodiment of the present system this is accomplished by the data interface 100 maintaining a list or "heap" (which need not necessarily be ordered) of events (such as the register access described above) which are scheduled to be performed in the future. Details of these events are supplied from the simulation blocks to the data interface.

When the data interface receives details of each such event from a simulation block, the data interface stores details of the specific actions to be taken, along with the time at which the action should be taken. However, the data interface passes only details of the time of execution to the scheduler in the primary simulator.

The primary simulator receives the time information from the data interface and schedules non-specific events to be initiated at those times. When each of the times is reached, the primary simulator sends a non-specific scheduling signal to the data interface. This causes the data interface to consult the heap of queued events, and to initiate the event (or events) such as the reading of an output value from a register simulation block arranged to take place at that time.

In this way, the only details of the queued events which must be supplied to the primary simulator are the times of execution; other details are handled by the data interface.

Figure 5:
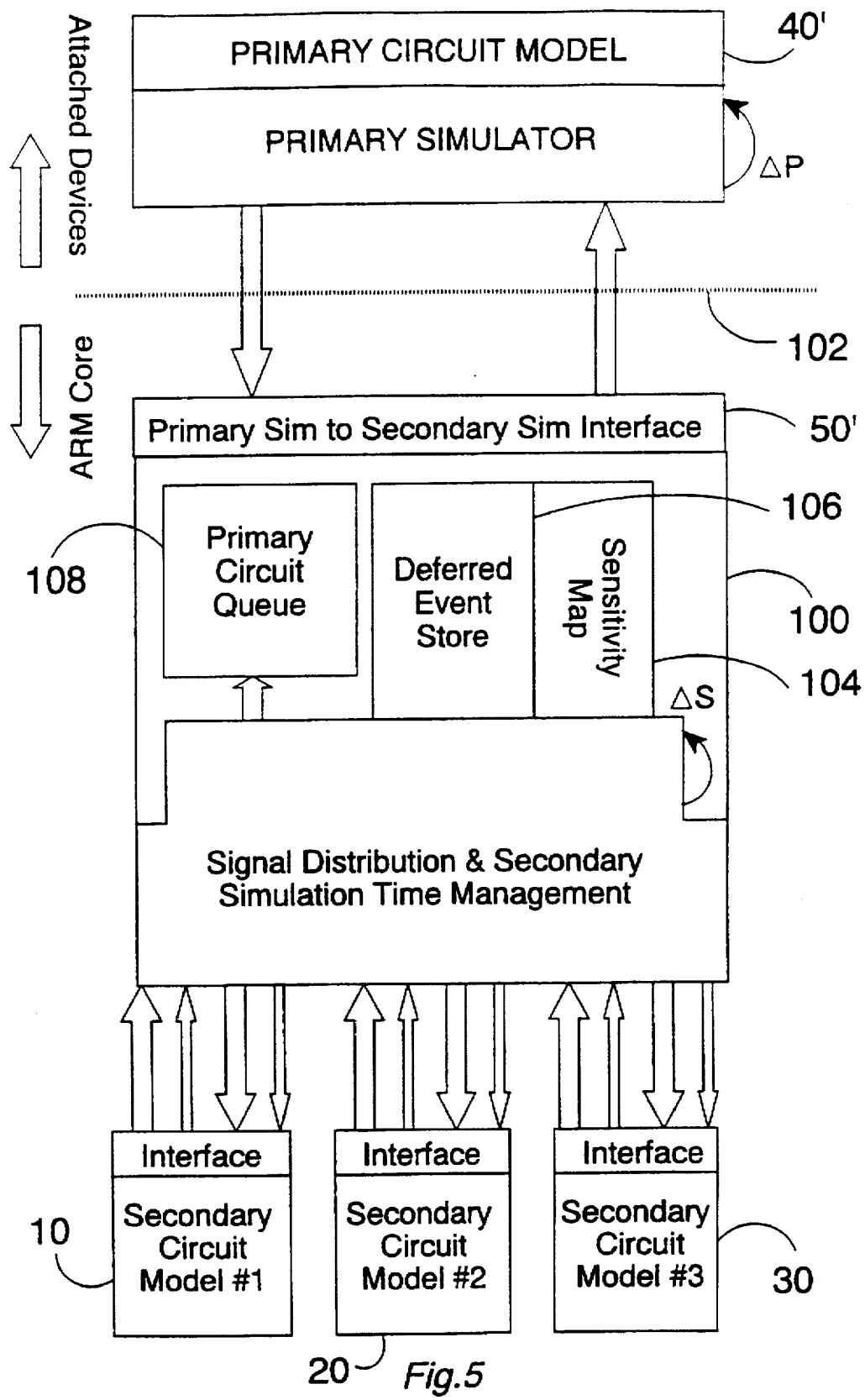
FIG. 5 shows a more detailed view of the system of FIG. 3.

FIG. 5 illustrates the system of FIG. 3 in more detail. The items below line 102 model a microprocessor core, such as an ARM6 core produced by Advanced RISC Machines Limited. The items above the line 102 model one or more attached devices and utilise a commercially available primary simulator 40' to which third parties attach their primary circuit models. The primary simulator 40' advances the primary simulated time in primary simulator time increments ΔP. When the primary simulator changes a signal to which at least one of the secondary circuit models 10, 20, 30 are responsive, then control is passed to the secondary simulator 100. The secondary simulator includes a sensitivity map 104 which stores data indicating which secondary circuit models 10, 20, 30 are responsive to which signals. As the signal distribution and secondary simulation time management block advances the secondary simulation time by secondary simulation time increments Δs (these may be delta time increments of zero duration), the signals to be passed between the various secondary circuit models 10, 20, 30 are routed to those models responsive to them and then control is passed to each secondary circuit model in turn so that it may determine its response and pass back other signals. These other signals are held within a deferred event store 106 which indicates the changed signal values that are to be produced and the times at which they are to be applied to the rest of the model. As the secondary simulation time advances, the deferred event store 106 is swept until all signal changes have been routed to their appropriate models within the plurality of secondary circuit models 10, 20, 30 and no further signals changes are being driven by the secondary circuit models 10, 20, 30.

Changes to any external signals of the plurality of secondary circuit models 10, 20, 30 are queued within a primary circuit queue 108. These signal changes are not dispatched to the primary simulator 40' until all the signal exchanges have taken place between the secondary circuit models 10, 20, 30. When this time is reached, the primary circuit queue 108 is searched and the last asserted value of each external signal that has changed is passed back to the primary simulator 40'.

Figure 6:
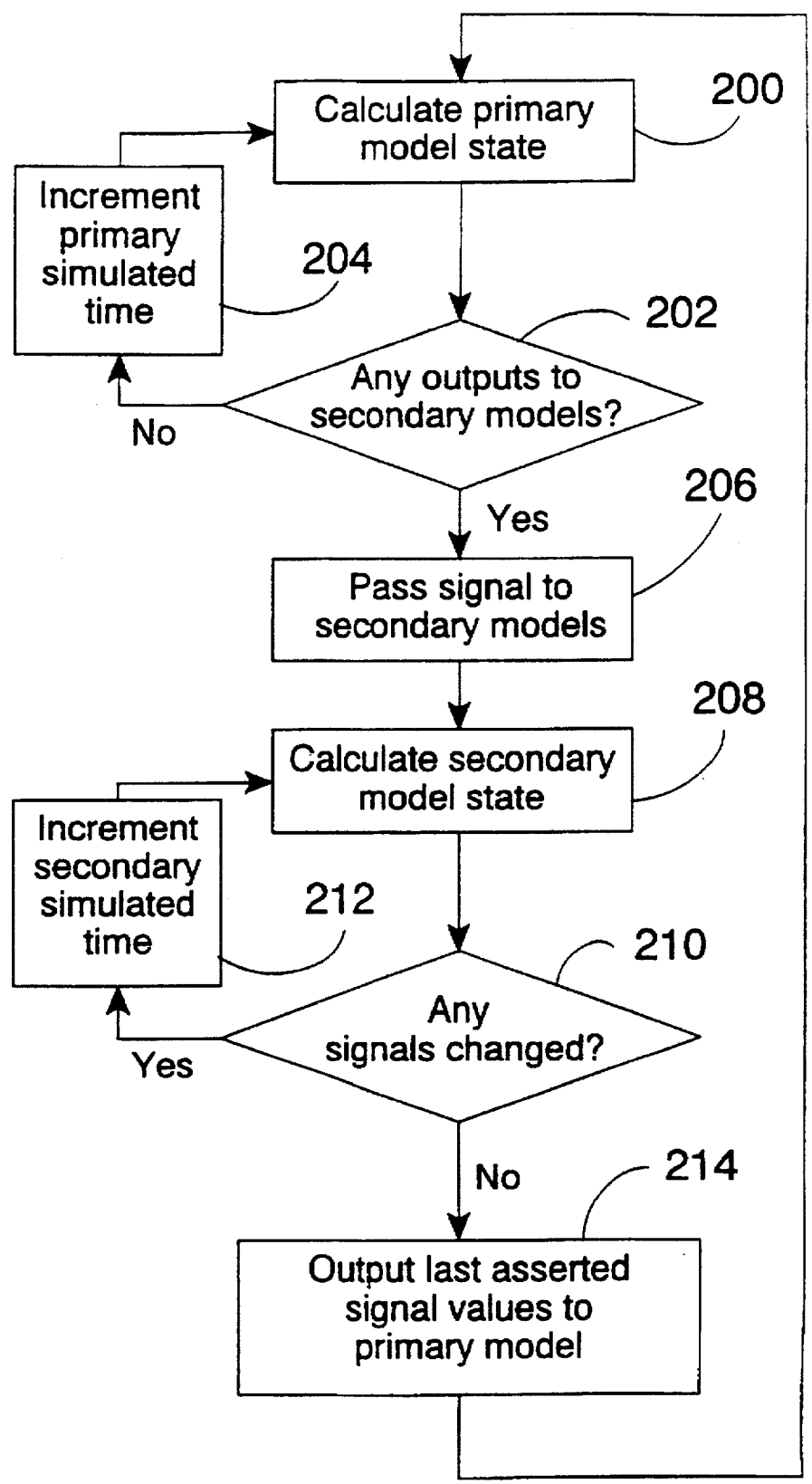
FIG. 6 is a flow diagram illustrating the passing of control between the primary simulation and the secondary simulation.

FIG. 6 schematically illustrates the operation of the system of FIG. 5. At step 200 the primary simulator 40' calculates the primary model state. At step 202 it is determined whether any outputs to which the secondary circuit simulator 100 is responsive (i.e. an external signal) has been changed. If no such signals have been changed, then the primary simulator time is incremented at step 204 and step 200 is repeated. If an external signal has changed, then control is passed to the secondary simulator 100 via step 206 and the state of the secondary circuit models 10, 20, 30 is calculated at step 208. At step 210 the signal distribution and the secondary simulation time management block of the secondary simulator 100 determines whether any signals are being driven to change by any of the secondary circuit models. If such change are still occurring, then the secondary simulated time is incremented at step 212. If no such changes are occurring, then the last asserted signal values of those signal values that have changed and to which the primary simulator 40' is responsive are returned to the primary simulator at step 214.

Figure 7:
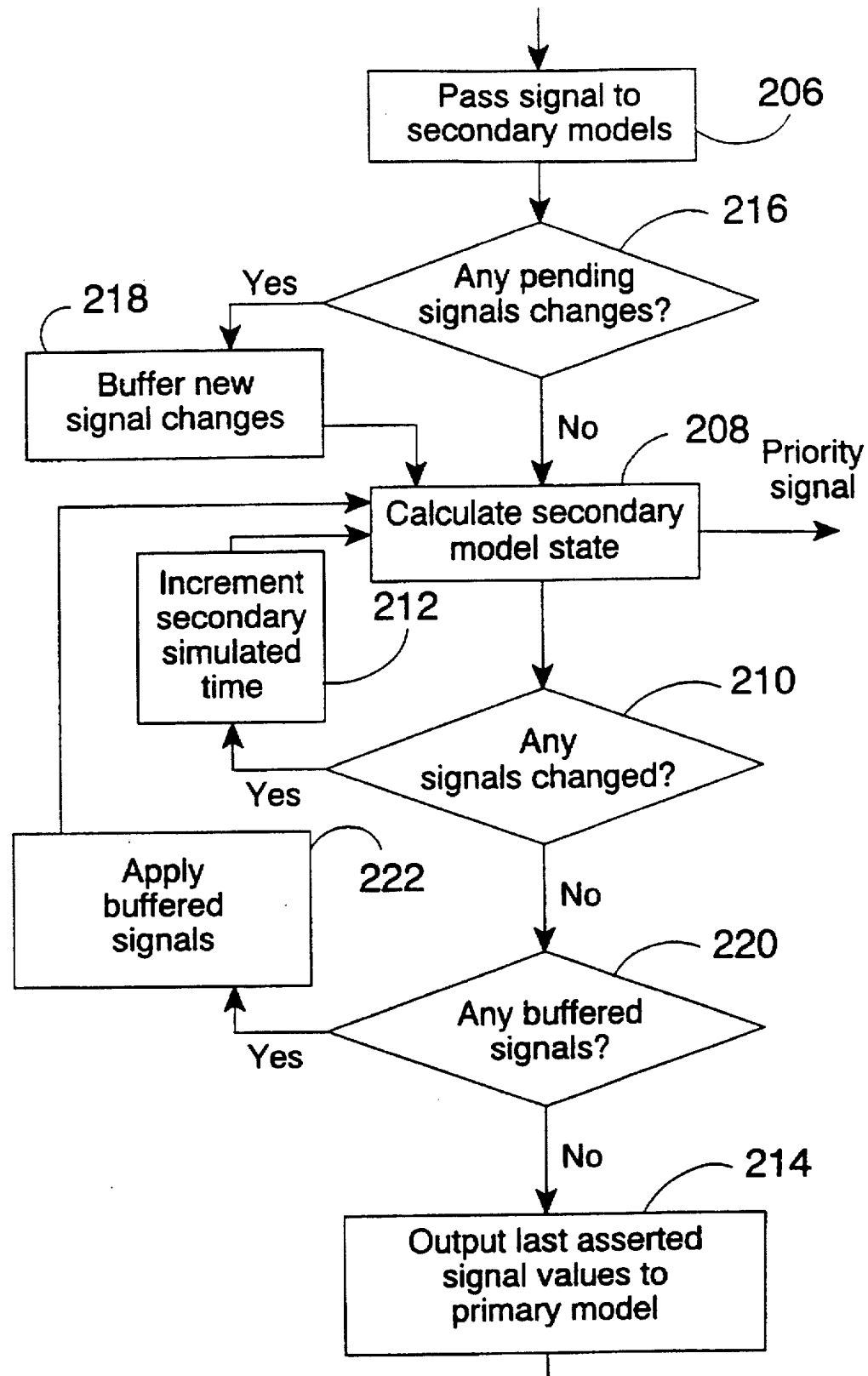
FIG. 7 schematically illustrates the flow of control in a modification of the system of FIG. 6 in which priority signals may be directly passed from the secondary circuit models to the primary circuit model.

FIG. 7 illustrates a modification of the flow of control of FIG. 6. When the secondary simulation is first entered at step 206, step 216 determines whether there are pending signal changes within the deferred event store 106. If there are such pending changes, then this indicates that the secondary simulation was exited from stage 208 as the result of a priority signal being passed back to the primary simulation before the signal changes being driven by the secondary circuit models 10, 20, 30 had stopped. In this case, the new signal change being passed from the primary signal to the secondary simulator 100 is buffered at step 218.

The secondary simulator 100 operates to calculate the secondary circuit models state and increment the secondary simulated time until no mope signal changes are being driven by the secondary circuit models 10, 20 30 (as in FIG. 6). An additional option exists at step 208 in which a priority signal may be issued that exits the secondary simulation and immediately returns to the primary simulation.

After the signal changes being driven by the secondary circuit models 10, 20, 30 have stopped, then step 220 determines whether there are any buffered signals that have been stored at step 218. If such buffered signals exist, then they are applied to the secondary model at step 222 and the secondary simulation continues until no further changes are being driven.

Finally, at step 212, control is returned to the primary simulator.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A method of simulating a digital circuit comprising a primary circuit coupled to a plurality of secondary circuits using a primary circuit model and a plurality of secondary circuit models, the primary circuit model being a logic model and each of the plurality of secondary circuit models being logic models, said method comprising the steps of:
   (i) simulating with said primary circuit model signals exchanged within said primary circuit, said primary circuit model operating through a sequence of primary simulated times separated by primary time increments;
   (ii) when said primary circuit model advances to a primary simulated time at which said primary circuit model changes a signal value to which at least one of said secondary circuit models is responsive, stopping simulating signals exchanged within said primary circuit, stopping incrementing said primary simulated time and passing said signal to said at least one of said secondary circuit models;
   (iii) simulating with said plurality of secondary circuit models signals exchanged between said plurality of secondary circuits, said plurality of secondary circuit models operating through a sequence of secondary simulated times separated by secondary time increments;
   (iv) detecting when no further signal exchanges are driven by said plurality of secondary circuit models and thereupon stopping incrementing said secondary simulated time and passing to said primary circuit model the last asserted value of any signals changed by said plurality of secondary circuit models during incrementing of said secondary simulated time and to which said primary circuit model is responsive; and
   (v) restarting simulation with said primary circuit model of signals exchanged within said primary circuit and incrementing of said primary simulated time.

2. A method as claimed in claim 1, wherein said plurality of secondary circuit models exchange only signals external to said plurality of secondary circuits with said primary circuit models.

3. A method as claimed in claim 1, wherein said plurality of secondary circuit models exchange with one another signals external to and internal to said plurality of secondary circuit models.

4. A method as claimed in claim 1, wherein any of said plurality of secondary circuit models may issue a priority signal to said primary circuit model that is passed to said primary circuit model whilst signal exchanges are still being driven by said plurality of secondary circuit models.

5. A method as claimed in claim 4, wherein, if said priority signal triggers passing of one or more further signals from said primary circuit model to said plurality of secondary circuit models, then said one or more further signals are buffered and not applied to said plurality of secondary circuit models until no further signal exchanges are driven by said plurality of secondary circuit models resulting from the state of said plurality of secondary circuit models preceding issue of said priority signal.

6. A method as claimed in claim 1, wherein at least some of said primary simulated time increments are delta time increments of substantially zero length.

7. A method as claimed in claim 1, wherein at least some of said secondary simulated time increments are delta time increments of substantially zero length.

8. A method as claimed in claim 1, wherein said primary circuit model passes a signal to an interface controller that buffers and redirects said signal to those of said plurality of secondary circuit models that are responsive to said signal.

9. A method as claimed in claim 8, wherein said interface controller stores data indicative of the asserted value of signals changed by said plurality of secondary circuit models and the secondary simulated time at which those changes occurred.

10. A method as claimed in claim 1, wherein said primary circuit model comprises a general purpose data processing apparatus operating under the control of primary program instructions to model said primary circuit.

11. A method as claimed in claim 10, wherein said plurality of secondary circuit models comprise said general purpose data processing apparatus operating under control of secondary program instructions to model said plurality of secondary circuits.

12. A method as claimed in claim 11, wherein said plurality of secondary circuit models represent a microprocessor circuit and said primary circuit model represents one or more devices to be connected to said microprocessor circuit.

13. An apparatus for simulating a digital circuit comprising a primary circuit coupled to a plurality of secondary circuits, said apparatus comprising:
   (i) a primary circuit model for simulating signals exchanged within said primary circuit, said primary circuit model operating through a sequence of primary simulated times separated by primary time increments;
   (ii) a plurality of secondary circuit models for simulating signals exchanged between said plurality of secondary circuits, said plurality of secondary circuit models operating through a sequence of secondary simulated times separated by secondary time increments; and
   (iii) an interface controller for controlling the passing of signals between said primary circuit model and said plurality of secondary circuit models; wherein,
   (iv) when said primary circuit model advances to a primary simulated time at which said primary circuit model changes a signal value to which at least one of said secondary circuit models is responsive, said primary circuit model stops simulating signals exchanged within said primary circuit, stops incrementing said primary simulated time and passes said signal via said interface controller to said at least one of said secondary circuit models; and
   (v) a detector for detecting when no further signal exchanges are driven by said plurality of secondary circuit models, said interface controller then stopping the incrementing of said secondary simulated time and passing to said primary circuit model the last asserted value of any signals changed by said plurality of secondary circuit models during incrementing of said secondary simulated time and to which said primary circuit model is responsive, whereupon said primary circuit model restarts simulation of signals exchanged within said primary circuit and incrementing of said primary simulated time.

* * * * *